(12) United States Patent
Ando et al.

(10) Patent No.: US 6,603,179 B2
(45) Date of Patent: Aug. 5, 2003

(54) SEMICONDUCTOR APPARATUS INCLUDING CMOS CIRCUITS AND METHOD FOR FABRICATING THE SAME

(75) Inventors: Koichi Ando, Tokyo (JP); Mariko Makabe, Tokyo (JP); Shin Koyama, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/995,513

(22) Filed: Nov. 28, 2001

(65) Prior Publication Data

US 2002/0063295 A1 May 30, 2002

(30) Foreign Application Priority Data

Nov. 30, 2000 (JP) ......................................... 2000-364245

(51) Int. Cl.[7] ..................... H01L 31/119; H01L 31/113; H01L 31/062; H01L 29/94; H01L 29/76; H01L 21/336; H01L 21/8238
(52) U.S. Cl. ....................... 257/369; 257/368; 257/288; 438/289; 438/217
(58) Field of Search .................................. 257/349, 350, 257/351, 69, 142, 146, 192, 204, 206, 213, 214, 217, 219, 288, 314, 369, 392, 411

(56) References Cited

U.S. PATENT DOCUMENTS

| 6,096,641 | A | * | 8/2000 | Kunikiyo | 438/653 |
| 6,436,753 | B1 | * | 8/2002 | Ikeda et al. | 438/238 |
| 2001/0016388 | A1 | * | 8/2001 | Koyama et al. | 438/275 |

FOREIGN PATENT DOCUMENTS

| JP | 5-267333 | 10/1993 |
| JP | 2000-124455 | 4/2000 |

* cited by examiner

*Primary Examiner*—Nathan J. Flynn
*Assistant Examiner*—Victor A. Mandala
(74) *Attorney, Agent, or Firm*—Choate, Hall & Stewart

(57) ABSTRACT

A semiconductor apparatus for increasing operating current is provided. The semiconductor apparatus is composed of a P-channel MISFET (Metal Insulator Semiconductor Field Effect Transistor) including a first gate insulator which contains first positive charges therein, and an N-channel MISFET including a second gate insulator which contains second positive charges therein. A first charge density of the first positive charge is larger than a second charge density of the second positive charge.

17 Claims, 15 Drawing Sheets

SEMICONDUCTOR APPARATUS INCLUDING CMOS CIRCUITS AND METHOD FOR FABRICATING THE SAME

BACKGROUND OF THE INVENTION

1. Field of the Invention

The present invention relates to a semiconductor apparatus. More particularly, the present invention relates to a semiconductor apparatus for improving an operational performance of CMOS (Complementary Metal Oxide Semiconductor) circuits, and a method of manufacturing the same.

2. Description of the Related Art

FIG. 1 shows a typical conventional CMOS circuit. The CMOS circuit includes CMOS inverters 1 and 2. The CMOS inverter 1 includes a PMOSFET (P-channel Metal Oxide Semiconductor Field Effect Transistor) 3 and an NMOSFET (N-channel MOSFET) 4. A source of the PMOSFET 1 is connected to power supply terminal VDD and a source of the NMOSFET 4 is connected to a ground terminal GND. The PMOSFET 3 and the NMOSFET 4 are connected on their drains and the drains are used as an output terminal OUT1 of the CMOS inverter 1. Gates of the PMOSFET 3 and the NMOSFET are connected to each other and used as an input terminal IN1. The CMOS inverter 2 includes a PMOSFET 5 and an NMOSFET 6 and has the same configuration as the CMOS inverter 1. The output terminal OUT1 of the CMOS inverters 1 is connected to an input terminal IN2 of the CMOS inverter 2.

The CMOS circuit shown in FIG. 1 is used for a buffer. When a rectangular signal is inputted to the input terminal IN1 of the CMOSFET 1, the CMOS inverter 1 inverts the rectangular signal to output to the CMOS inverter 2. The CMOS inverter 2 inverts the inverted rectangular signal to output from the output terminal OUT2. Then, a rectangular signal is outputted from the output terminal OUT2, representing the same logical value as the rectangular signal inputted to the input terminal IN1.

The operation speed of the CMOS circuit depends on operating currents of the MOSFETs. As for the CMOS inverter 1, the PMOSFET 3 is turned off and the NMOSFET 4 is turned on in response to the pull-up of the input signal inputted to the input terminal IN1. The NMOSFET 4 generates the operating current from the output terminal OUT2 to the grounded terminal to pull down the output terminal OUT1. When the input signal is pulled down, the PMOSFET 3 is turned on and the NMOSFET 4 is turned off. The PMOSFET 3 generates the operating current from the power supply terminal $V_{cc}$ to the output terminal OUT1 to pull up the output terminal OUT1. As the operating currents of the respective MOSFETs are larger, the operation speed of the CMOS circuit is improved.

The increase of the operating current is achieved by reducing the impurity concentration of channel regions of the MOSFETS. The operating current in the MOSFETs depends on the impurity concentration of channel regions of the MOSFETs. A decrease in the impurity concentration of the channel region results in an increase in the operating current, because the decreased impurity concentration reduces the scattering of the carriers in the channel region and thereby increases the operation speed of the carriers.

In the conventional CMOS circuit, however, the impurity concentration of the channel regions must be fixed to obtain a predetermined threshold voltage Vth, which is defined by amplitude of signal in the CMOS circuit. The impurity concentration is a main factor to determine the threshold voltage Vth of MOSFETs. The decrease of the impurity concentration of the channel region of the NMOSFET for improving the operating current is accompanied by a decrease in positive threshold voltage Vth of the NMOSFET, that is, the threshold voltage Vth of the NMOSFET shifts toward a negative voltage. Also, the decrease of the impurity concentration of the channel region of the PMOSFET for improving the operating current is accompanied by decrease a negative voltage Vth in the PMOSFET, that is, the negative threshold voltage Vth of the PMOSFET shifts toward a positive voltage. Here and hereinafter, an increase of the threshold voltage Vth implies an increase in an absolute value of the threshold voltage Vth. Also, a decrease of the threshold voltage Vth implies a decrease in an absolute value of the threshold voltage Vth. Thus, the channel impurity concentration is not defined so as to improve the operating current.

Mogami discloses a CMOS technology in Japanese Laid Open Patent Application (JP-A-Heisei 5-267333), which may be related to the present invention. Mogami discloses a method for improving a hot carrier resistance by introducing fluorine ions into the gate insulator.

Also, Miura discloses another CMOS technique in Japanese Laid Open Patent Application (JP-A-Heisei 2000-124455). Miura discloses a method for removing or decreasing the positive fixed charges in the gate insulator by applying ultra violet light to the gate insulator.

SUMMARY OF THE INVENTION

The present invention is to provide a technique for improving an operational performance of a CMOS circuit by increasing an operating current of MOSFETs.

In order to achieve an aspect of the present invention, a semiconductor apparatus is composed of a P-channel MISFET (Metal Insulator Semiconductor Field Effect Transistor) an N-channel MISFET. The P-channel MISFET includes a first gate insulator which contains first positive charges therein. The N-channel MISFET includes a second gate insulator which contains second positive charges therein. A first charge density of the first positive charge is larger than a second charge density of the second positive charge.

The first charge density is preferably three to four times as large as the second charge density.

The first and second gate insulators are preferably formed of silicon oxinitride.

The first positive charges are preferably induced by nitrogen ions.

The second positive charges are preferably induced by nitrogen ions.

In order to achieve another aspect of the present invention, a semiconductor apparatus is composed of a P-channel MISFET and an N-channel MISFET. The P-channel MISFET includes a first gate insulator which contains positive charges therein. The N-channel MISFET includes a second gate insulator which contains substantially no charge therein.

For this case, the first and second gate insulators are preferably formed of silicon oxide.

In order to achieve still another aspect of the present invention, a semiconductor apparatus is composed of a P-channel MISFET and an N-channel MISFET. The P-channel MISFET includes a first gate insulator which contains substantially no charge therein. The N-channel MISFET includes a second gate insulator which contains negative charges therein.

The negative charges are preferably induced by fluorine ions.

In order to achieve still another aspect of the present invention, a semiconductor apparatus is composed of a P-channel MISFET and an N-channel MISFET. The P-channel MISFET includes a first gate insulator which contains positive charges therein. The N-channel MISFET includes a second gate insulator which contains negative charges therein.

In order to achieve still another aspect of the present invention, a method for fabricating a semiconductor apparatus is composed of:

providing an N region in a surface portion of a substrate for a P-channel MISFET;

providing a P region in another surface portion of the substrate for an N-channel MISFET;

forming a silicon oxinitride film containing positive charges on the N region and P region, the silicon oxinitride film including:
a first portion located on the N region and,
a second portion located on the P region;

annealing the silicon oxinitride film to adjust a charge density in the silicon oxinitride film such that a first charge density of the first portion is larger than a second charge density of the second portion; and forming gate electrodes on the silicon oxinitride film after the annealing.

The annealing is preferably executed for substantially one minute at a temperature between 1000 to 1100° C.

The first charge density is three to four times as large as the second charge density In order to achieve still another aspect of the present invention, a method for fabricating a semiconductor apparatus is composed of:

providing an N region in a surface portion of a substrate for a P-channel MISFET;

providing a P region in another surface portion of the substrate for an N-channel MISFET;

forming a first gate insulator of a on the N region;

forming a second gate insulator on the P region; and introducing positive charges into the first gate insulator while introducing substantially no positive charge into the second gate insulator.

In this case, it is preferable that the method is further composed of forming a gate electrode on the first gate insulator, and the introducing includes:

implanting nitrogen ions into the gate electrode; and diffusing the nitrogen ions into the first gate insulator by annealing.

In order to achieve still another aspect of the present invention, a method for fabricating a semiconductor apparatus is composed of:

providing an N region in a surface portion of a substrate for a P-channel MISFET;

providing a P region in another surface portion of the substrate for an N-channel MISFET;

forming a first gate insulator on the N region;

forming a second gate insulator on the P region;

forming a first gate electrode on the first gate insulator;

forming a second gate electrode on the second gate insulator; and introducing negative charges into the second gate insulator while introducing substantially no negative charge into the first gate insulator.

It is preferable that the method is further composed of forming a gate electrode on the second gate insulator, and the introducing includes:

implanting fluorine ions into the gate electrode; and diffusing the fluorine ions into the second gate insulator by annealing.

In order to achieve still another aspect of the present invention, a method for fabricating a semiconductor apparatus is composed of:

providing an N region in a surface portion of a substrate for a P-channel MISFET;

providing a P region in another surface portion of the substrate for an N-channel MISFET;

forming a first gate insulator on the N region;

forming a second gate insulator on the P region;

forming a first gate electrode on the first gate insulator;

forming a second gate electrode on the second gate insulator;

introducing positive charges into the first gate insulator; and introducing negative charges into the second gate insulator.

DESCRIPTION OF THE PREFERRED EMBODIMENTS

Embodiments of the present invention will be described below with reference to the attached drawings.

First Embodiment

Figure 1:
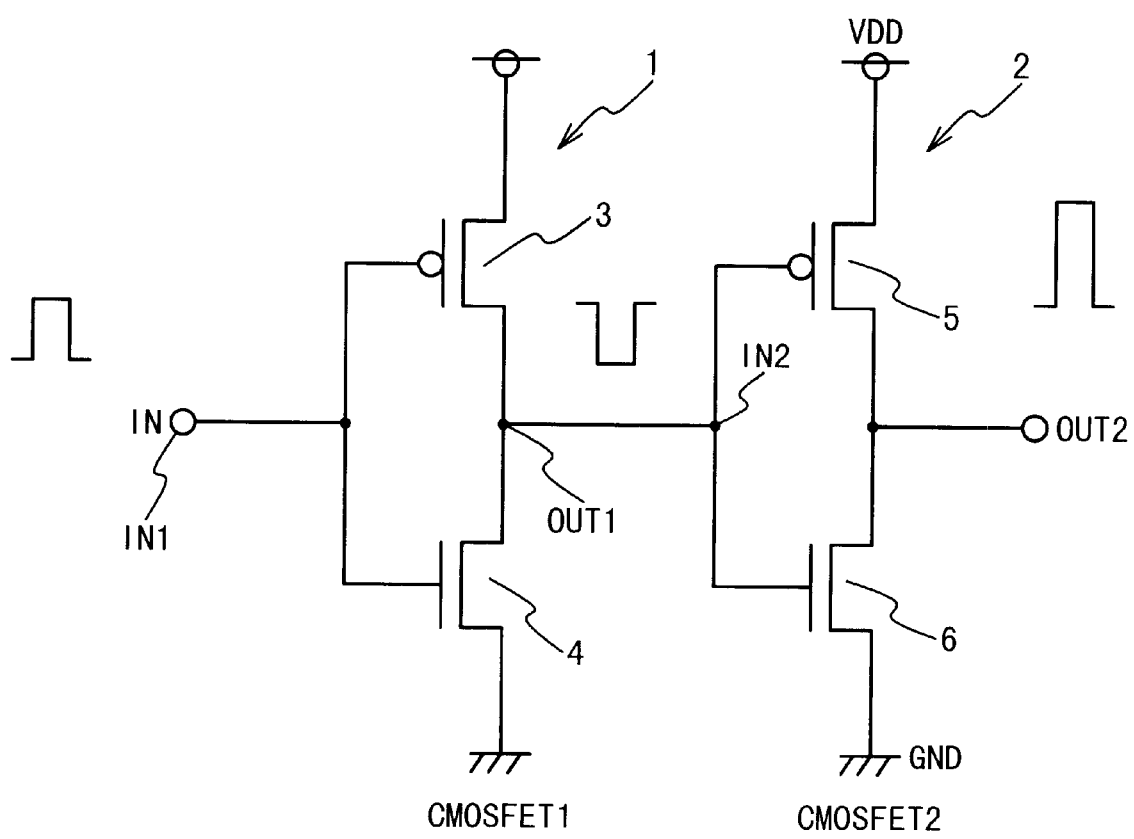
FIG. 1 shows a typical conventional CMOS circuit.
Figure 2:
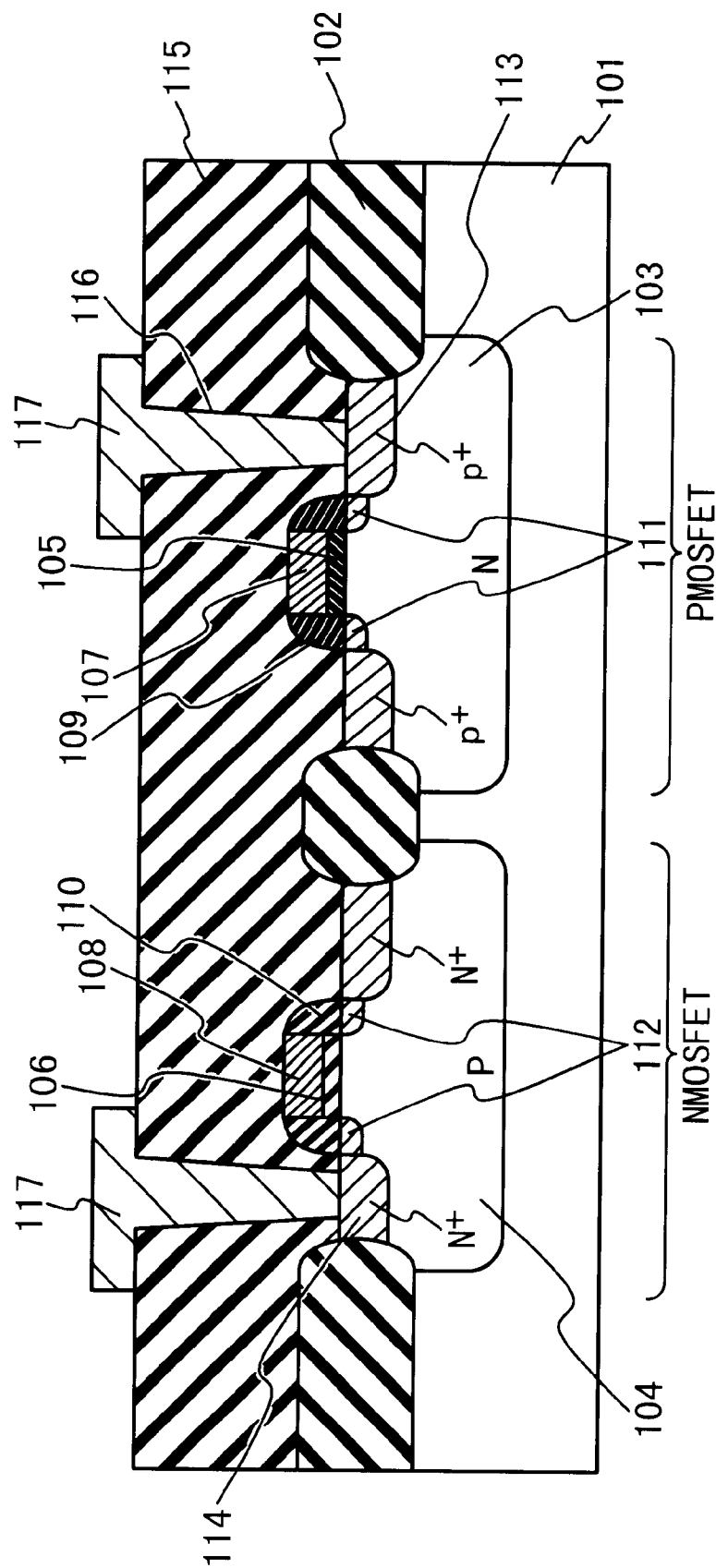
FIG. 2 shows a sectional view of a semiconductor apparatus in a first embodiment according to the present invention.
Figure 3:
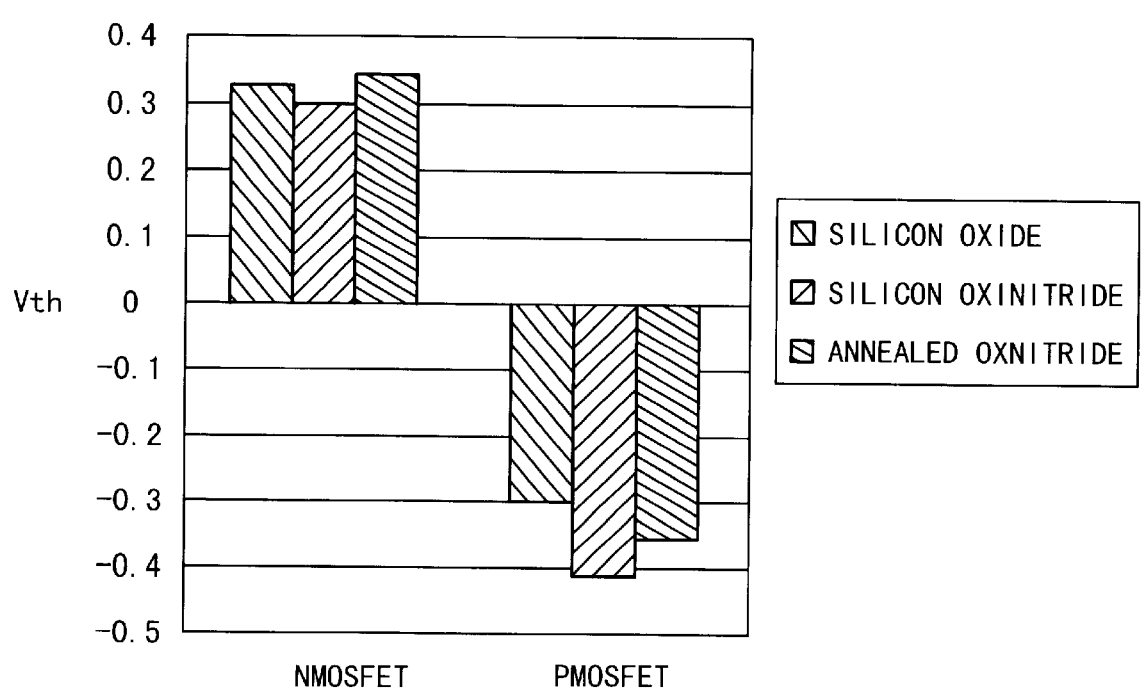
FIG. 3 shows threshold voltages Vth of MOSFETs in the first embodiment.

FIG. 2 is a sectional view of a semiconductor apparatus in a first embodiment according to the present invention. A PMOSFET formation region and an NMOSFET formation region are separated by a field oxide film 102 formed on a surface of a silicon substrate 101. A PMOSFET is formed in the PMOSFET formation region, and an NMOSFET is formed in the NMOSFET formation region.

For the PMOSFET, an N-well 103 is formed in a surface portion of the silicon substrate 101 in the PMOSFET formation region. A gate insulator 105 made of silicon oxide nitride is formed on the N-well 103. A gate electrode 107 made of polycrystalline silicon are formed on the gate insulator 105. Sidewalls 109 made of silicon oxide film are formed on both sides of the gate electrode 107. LDD (Lightly Doped Drain) regions 111 and P+ source/drain regions 113 are formed in the surface portion of the N-well 103. The LDD regions 111 are lightly doped with P-type dopants. The source/drain regions 113 are heavily doped with P-type dopants.

For the NMOSFET, a P-well 104 is formed in the NMOSFET formation region. A gate insulator 106 made of silicon oxide nitride is formed on the P-well 104. A gate electrode 108 made of polycrystalline silicon are formed on the gate insulator 106. Sidewalls 110 made of silicon oxide film are formed on both sides of the gate electrode 108. LDD regions 112 and N+ source/drain regions 114 are formed in the surface portion of the P-well 104. The LDD regions 112 are lightly doped with N-type dopants and the N+ source/drain regions 114 are heavily doped with N-type dopants.

An interlayer dielectric 115 is formed on the entire surface of the silicon substrate 101. Contact holes 116 are formed through the interlayer dielectric 115 to the P+ source/drain regions 113 and the N+ source/drain regions 114. Interconnections 117 made of metal such as aluminum are formed through contact holes 116.

The PMOSFET and the NMOSFET are connected by the interconnections 117 to constitute a CMOS circuit. For providing a CMOS inverter, one of the P+ source/drain regions 113 is connected to a power supply terminal by the interconnections 117, and the other is connected to one of the N+ source/drain regions 114 by the interconnections 117. The other of the N+ source/drain regions 114 is connected to a grounded terminal. The gate electrodes 107, and 108 are connected to each other by another interconnection (not shown).

The gate insulators 105, 106, which are respectively provided for the PMOSFET and the NMOSFET, are formed such that the gate insulators 105, 106 contains positive fixed charges. The charge density of the gate insulator 105 is greater than that of the gate insulator 106. The charge density of the gate insulator 105 is preferably 3 to 4 times as much as that of the gate insulator 106.

The positive fixed charges in the gate insulator 105 of the PMOSFET cause a positive bias to be applied to a channel region of the PMOSFET, and the threshold voltage Vth of the PMOSFET is changed toward a negative direction. In other words, the positive fixed charges increases the absolute value of the threshold voltage Vth of the PMOSFET. For obtaining a predetermined threshold voltage Vth, an impurity concentration in the channel region of the PMOSFET can be decreased correspondingly, which increases the operating current.

On the other hand, the positive fixed charges in the gate insulator 106 of the NMOSFET shifts the threshold voltage Vth of the NMOSFET toward a negative direction. That is, the positive fixed charges in the gate insulator 106 decreases the absolute value of the threshold voltage Vth of the NMOSFET. For obtaining a predetermined threshold voltage Vth, the channel impurity concentration in the channel region of the NMOSFET must be increased correspondingly, which decreases the operating current of the NMOSFET.

Figure 4:
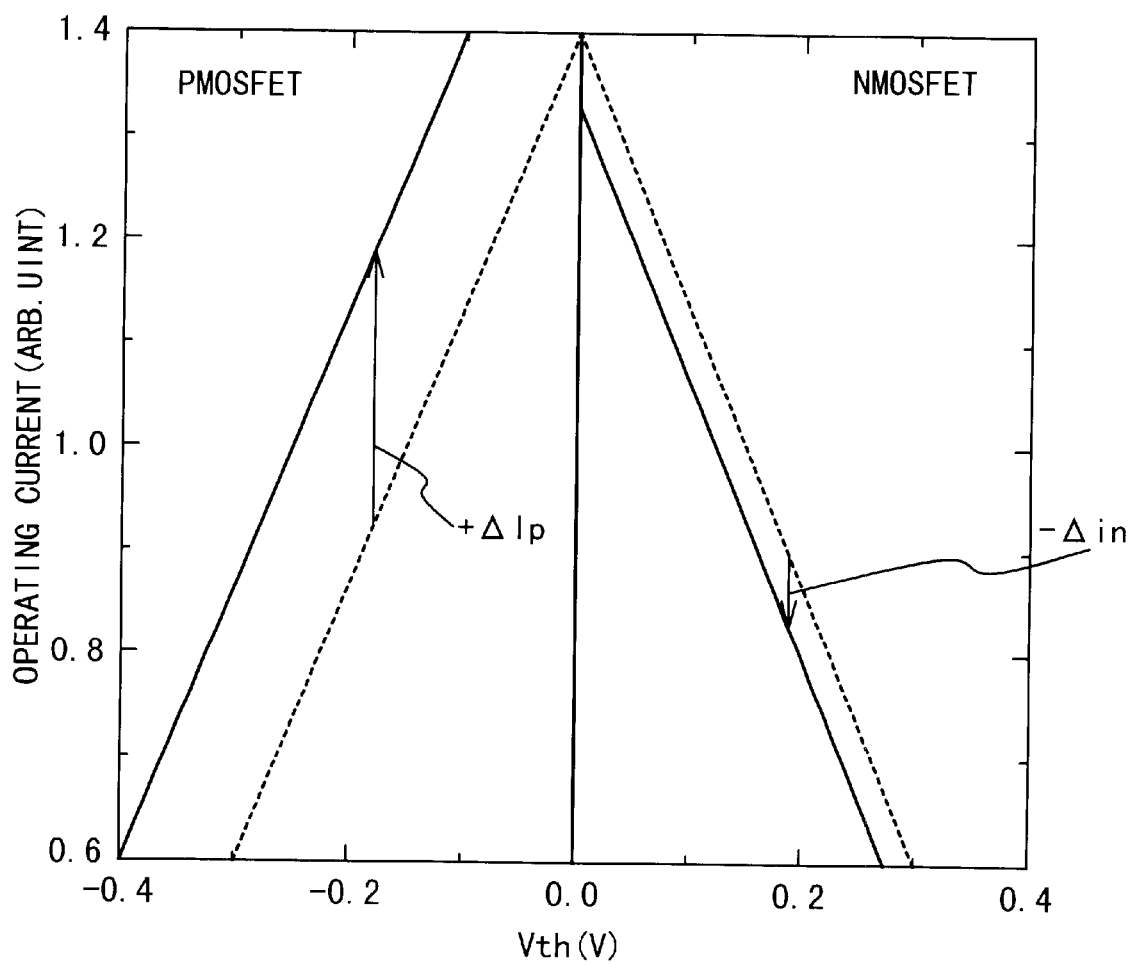
FIG. 4 shows threshold voltages of PMOSFET and NMOSFET in the first embodiment.

As a whole, however, the operation speed of the CMOS circuit is increased. This results from the different charge densities of the gate insulators 105 and 106. FIG. 4 shows operating currents of the CMOS circuit in the first embodiment according to the present invention and a conventional CMOS circuit. The gate insulators of MOSFETs in the conventional CMOS circuit are formed of silicon oxide. The solid lines in FIG. 4 indicate the operating currents of the NMOSFET and the PMOSFET in the first embodiment, and the broken lines indicate those of the conventional PMOSFET and NMOSFET, whose gate insulators are formed of silicon oxide. The horizontal axis indicates the threshold voltage Vth, which depends on the impurity concentration of the channel regions. For the same threshold voltages, an increase $\Delta Ip$ in the operating current of the PMOSFETs is greater than a decrease $\Delta In$ in the operating current of the NMOSFETS. Generally, the operating current of the PMOSFETs is smaller than that of the NMOSFETs and the operation speed of a CMOS circuit is mainly determined by the operating current of the PMOSFETs. Therefore, the larger increase in the operating current of the PMOSFETs improves the operation speed of the CMOS circuit.

Figure 5A:
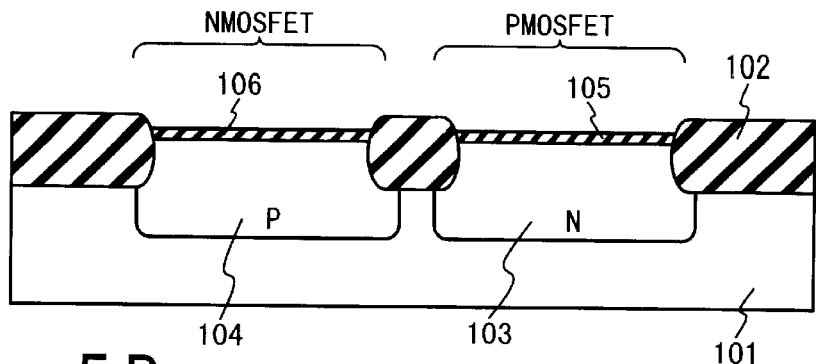
FIGS. 5A to 5D are sectional views showing a manufacturing process in the first embodiment.

The method of manufacturing the semiconductor apparatus in the first embodiment is described below. At first, as shown in FIG. 5A, a surface of a silicon substrate 101 is selectively oxidized to form a field oxide film 102. A PMOSFET formation region and an NMOSFET formation region are separated by the field oxide film 102.

Then, N-type dopants such as phosphorus and arsenic are implanted into the PMOSFET formation region to form an N-well 103. Then P-type dopants such as boron are implanted into the NMOSFET formation region to form the P-well 104.

After that, P-type dopants are additionally implanted into the channel region of the PMOSFET to control the threshold voltage of the PMOSFET. Also, N-type dopants are additionally implanted into the NMOSFET formation region. The amounts of the additionally implanted dopants are determined so as to the desired threshold voltages Vth of the PMOSFET and the NMOSFET.

Next, after cleaning of the surface of the silicon substrate 101, an oxidation at 900° C. for 30 seconds is carried out in $O_2$ gas atmosphere to form the silicon oxide films on the N-Well 103 and the P-Well 104. In succession, the silicon oxide films are nitrified at 900° C. for 15 seconds in a nitric oxide (NO) gas atmosphere to form the gate insulators 105, and 106, which are made of the silicon oxide nitride film. The gate insulators 105, and 106 have a thickness of 20 A.

Figure 5B:
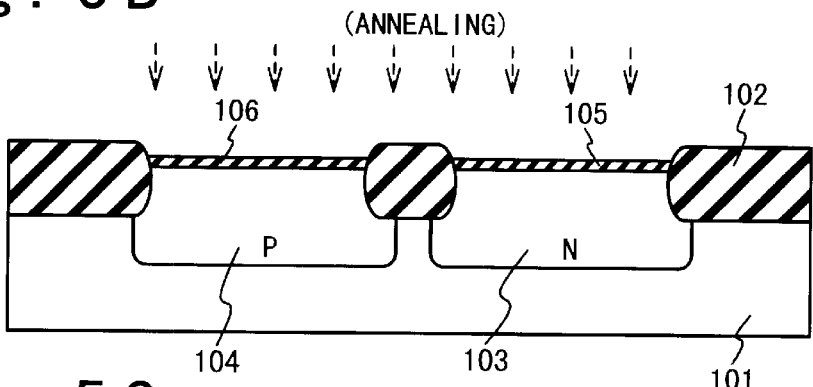

Then, as shown in FIG. 5B, a high temperature annealing is executed to control the charge densities of the positive fixed charges respectively existing in the films of the gate insulators 105, 106. The annealing is executed at a temperature of 1050 to 1100° C. in $N_2$ gas atmosphere is performed on the gate insulators 105, 106.

The annealing time is determined on the basis of the charge density of the positive fixed charges to be remained in the gate insulators 105, 106. The longer annealing time reduces the charge density of the positive fixed charges in the gate insulators 105, 106. In the first embodiment, the annealing time is very short and close to 0. The high temperature annealing may be omitted for the charge density to be controlled or the conditions of the above-mentioned oxidation and nitrification for manufacturing the gate insulators 105, and 106. Anyway, the annealing time is preferably less than five minutes. As a result, the charge density of the positive fixed charges in the gate insulator 105 of the PMOSFET is adjusted to 3 to 4 times as much as that in the gate insulator 106 of the NMOSFET.

Figure 5C:
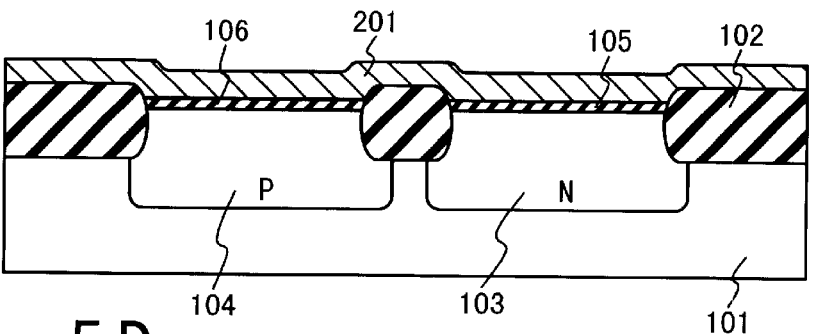

Next, as shown in FIG. 5C, a polycrystalline silicon film 201 is grown on the gate insulators 105 and 106 by an LPCVD (Low Pressure Chemical Vapor Deposition). The polycrystalline silicon film 201 has a thickness of about 1500 Å.

Figure 5D:
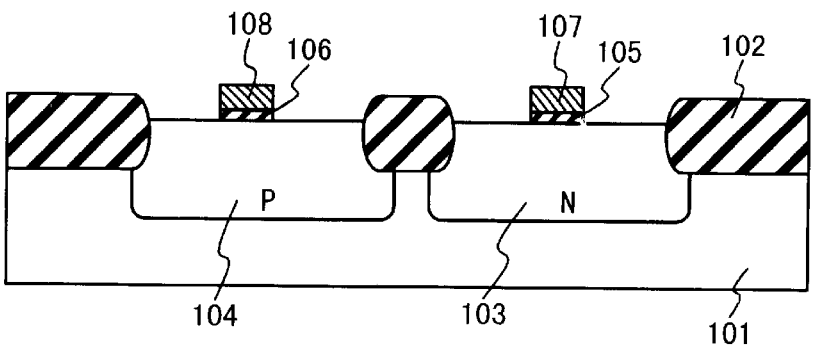

In succession, the polycrystalline silicon film 201 is patterned by a photolithography technique to form the gate electrodes 107, 108 in the respective formation regions of the PMOSFET and the NMOSFET, as shown in FIG. 5D.

Figure 6A:
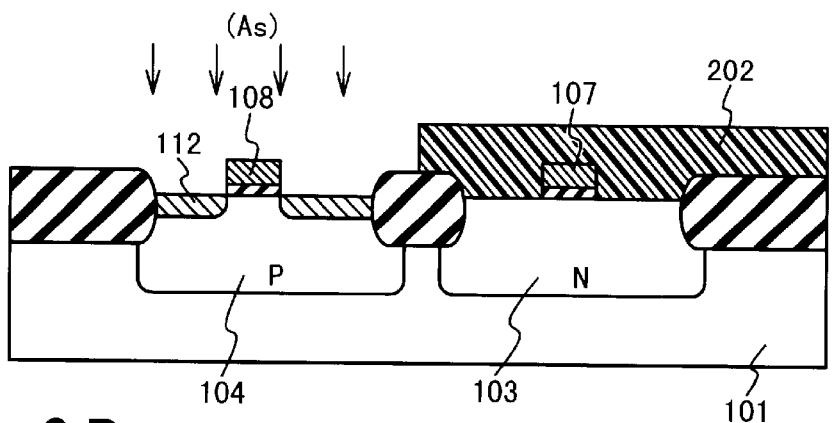
FIGS. 6A to 6D are sectional views showing the manufacturing process in the first embodiment.

After the PMOSFET formation region is covered by a photo resist 202 as shown in FIG. 6A, arsenic ions are implanted into the NMOSFET formation region at a dose level of $10^{14}/cm^2$ with an acceleration energy of 10 keV to form an N-type LDD region 112.

Figure 6B:
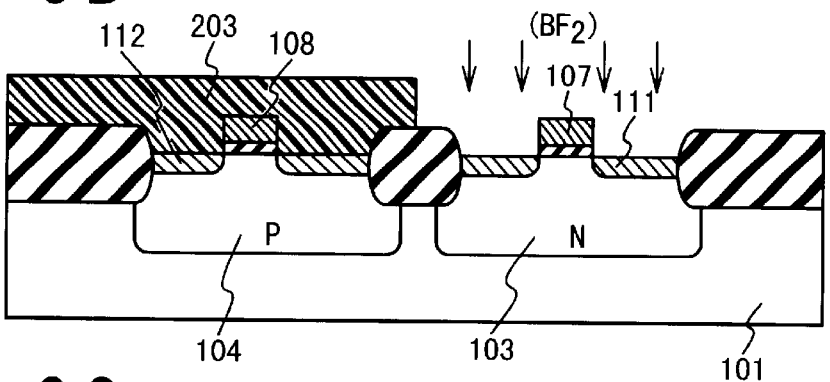

Then, after the NMOSFET formation region is covered by a photo resist 203 as shown in FIG. 6B, boron fluoride ($BF_2$) ions are implanted into the PMOSFET formation region at a dose level of $10^{14}/cm^2$ to form a P-type LDD region 111.

Figure 6C:
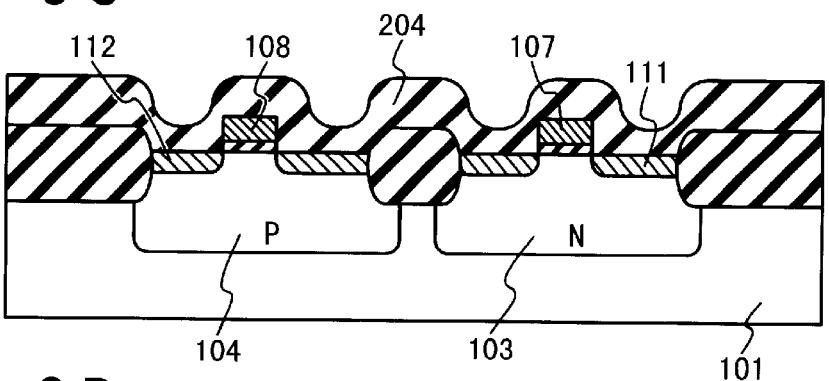
Figure 6D:
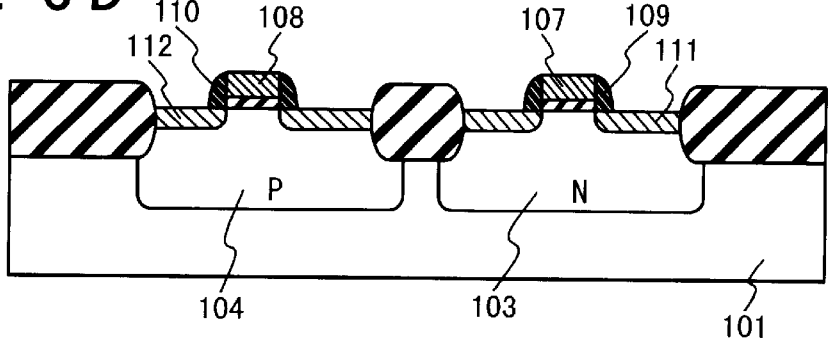

As shown in FIG. 6C, a silicon oxide film 204 having a thickness of 100 Å is formed by an LPCVD to cover the on the entire surface of the silicon substrate 101. Then, as shown in FIG. 6D, the silicon oxide film 204 is anisotropically etched to form sidewalls 109, 110 on the respective sides of the gate electrodes 107, 108.

Figure 7A:
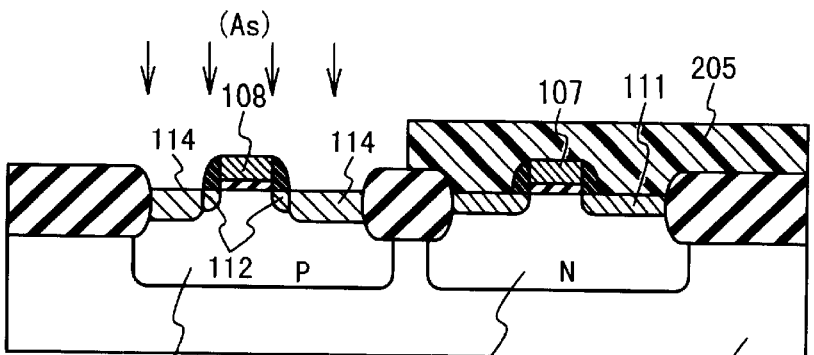
FIGS. 7A to 7D are sectional views showing the manufacturing process in the first embodiment.

After the PMOSFET formation region is covered by a photo resist 205 as shown in FIG. 7A, arsenic ions are implanted at a dose level of $5 \times 10^{15}/cm^2$ with an acceleration energy of 50 keV into the NMOSFET formation region to form an N+ source/drain regions 114.

Figure 7B:
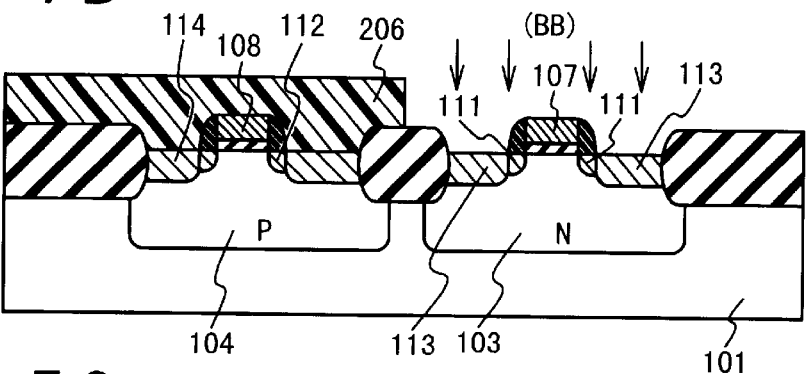

Then, after the NMOSFET formation region is covered by a photo resist 206 as shown in FIG. 7B, boron ions are implanted at a dose level of $5 \times 10^{15}/cm^2$ with an acceleration energy of 10 keV into the PMOSFET formation region to form a P+ source/drain regions 113.

Figure 7C:
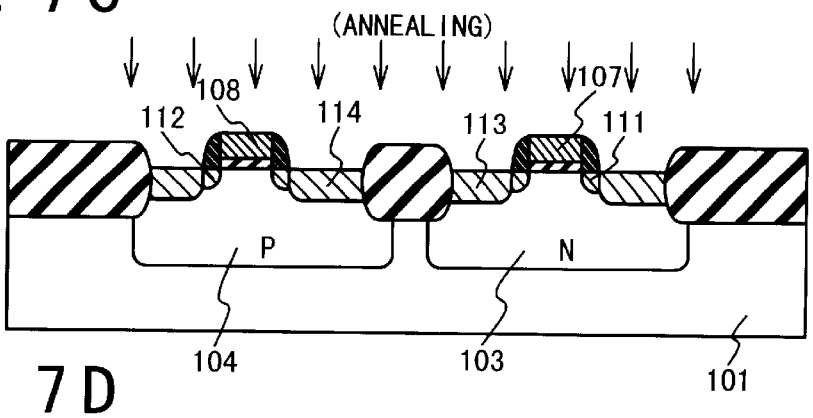

After that, as shown in FIG. 7C, an annealing at 1000° C. for 60 seconds is carried out at $N_2$ gas atmosphere to activate the implanted dopants.

Figure 7D:
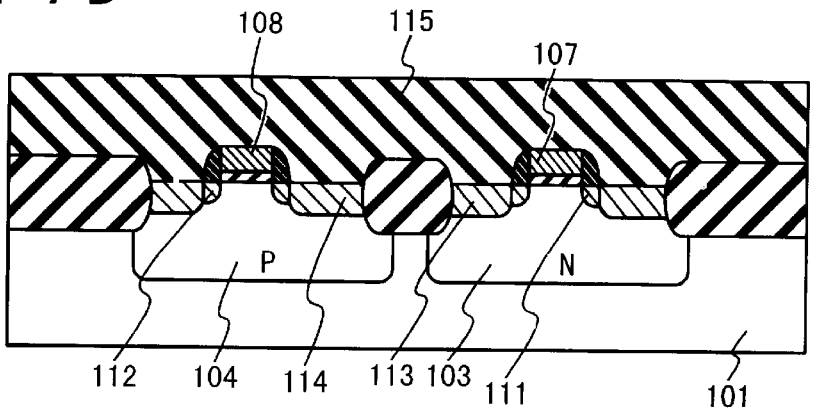

After that, as shown in FIG. 7D, an interlayer dielectric 115 is formed. After that, a contact hole 116 is formed through the interlayer dielectric 115, and then aluminum interconnections 117 are formed. Accordingly, the semiconductor apparatus is manufactured as shown in FIG. 2.

In the first embodiment, the charge density of the positive fixed charges in the gate insulator 105 of the PMOSFET is controlled to be about 3 to 4 times as much as that in the gate insulator 106 of the NMOSFET. The control is achieved by the high temperature annealing at the nitrogen atmosphere after the formation of the gate insulators 105, 106. The control of the charge densities largely increases the operating current of the PMOSFET while reducing the decrease in the operating current of the NMOSFET. This improves the drive performance of the CMOS circuit embedded in the semiconductor apparatus.

Second Embodiment

In the second embodiment, different charge densities are adopted for the gate insulators 105, 106. The charge densities are controlled such that the charge density in the gate insulator 105 of the PMOSFET is 1 to 2 times as much as that in the gate insulator 106 of the NMOSFET. The control is achieved by controlling the annealing time executed after the formations of the gate insulators 105, and 106. The impurity concentrations of the channel regions of the PMOSFET and the NMOSFET are determined so as to attain the desirable threshold voltages of PMOSFET and the NMOSFET.

Figure 8:
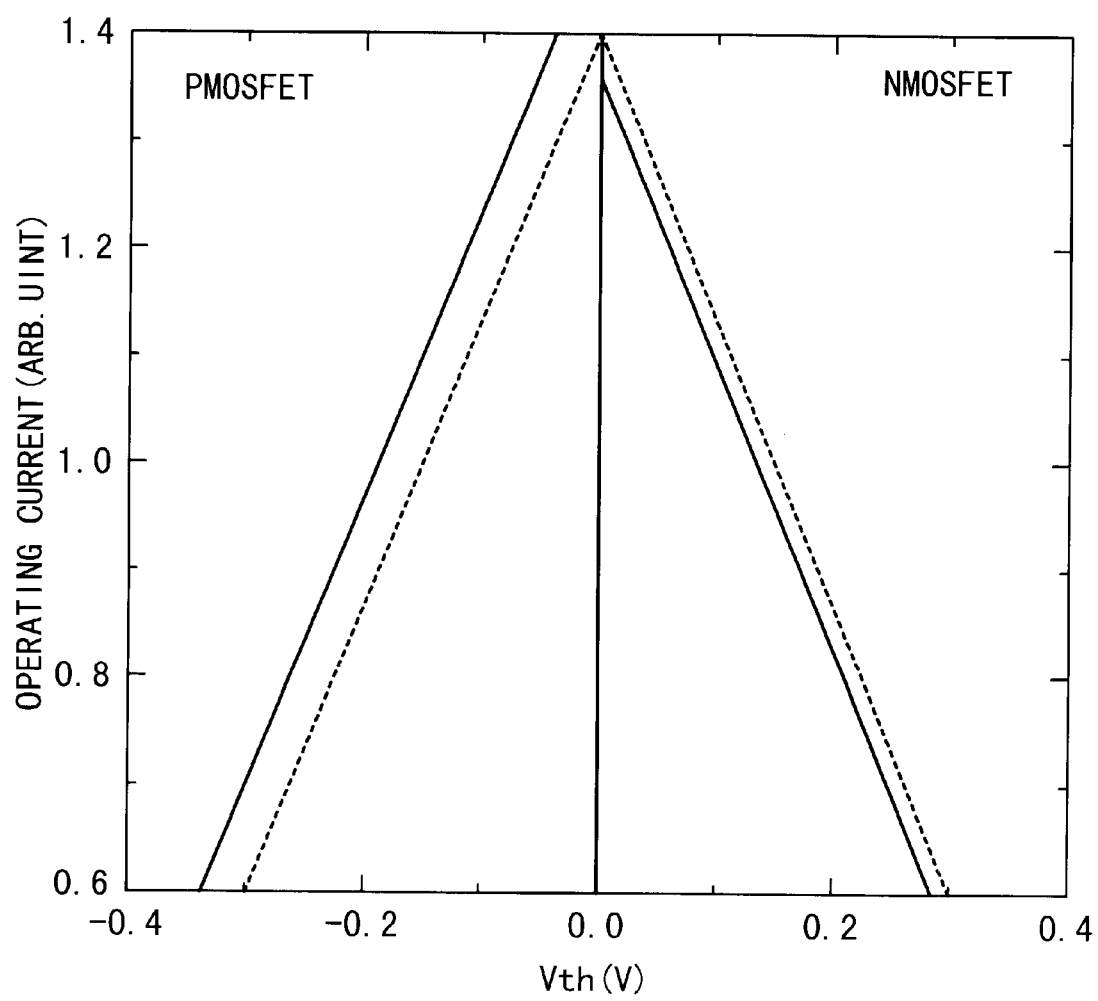
FIG. 8 shows threshold voltages of a PMOSFET and an NMOSFET in a second embodiment.

In the second embodiment as shown in FIG. 8, the operating current of the PMOSFET is slightly smaller than that in the first embodiment. However, the operating current of the NMOSFET is increased over that of the first embodiment. This implies the improvement of the drive performance of the NMOSFET. Hence, under the condition that the increase in the operating current of the PMOSFET is greater than the decrease in the operating current of the NMOSFET, the total operating current of the CMOS circuit is increased. The increased total operating current improves the operation speed of the CMOS circuit.

Third Embodiment

Figure 9A:
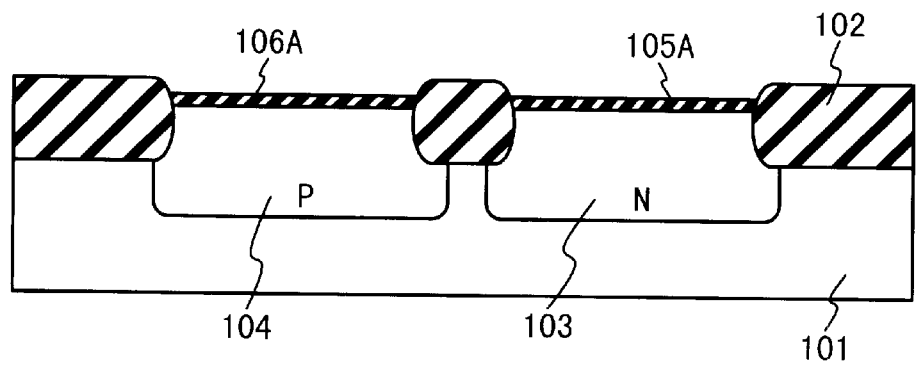
FIGS. 9A to 9C are sectional views showing a manufacturing process in a third embodiment.

In a third embodiment, the semiconductor apparatus has the same configuration as the first embodiment except for gate insulators. As shown in FIG. 9A, the gate insulator 105 and 106 in the first embodiment are respectively replaced by gate insulators 105A, and 106A which are made of silicon oxide.

The charge densities of the gate insulators 105A, 106A in the third embodiment are different form those of the gate insulators 105, 106 in the first embodiment. The gate insulator 105A of the PMOSFET contains positive fixed charges while the gate insulator 106A of the NMOSFET contains substantially no positive or negative fixed charge.

The method for manufacturing the semiconductor apparatus in the third embodiment is as follows. At first, as shown in FIG. 9A, the silicon substrate 101 is selectively oxidized to form the field oxide film 102. The field oxide film 102 separates the PMOSFET formation region and the NMOSFET formation region. Then, N-type dopants such as phosphorus and arsenic are implanted into the PMOSFET formation region to form the N-well 103. And P-type dopants such as boron are implanted into the NMOSFET formation region to form the P-well 104. After that, P-type dopants are additionally implanted into the PMOSFET formation region to control the threshold voltage of the PMOSFET. Then, N-type dopants are additionally implanted into the NMOSFET formation region to control the threshold voltage of the NMOSFET. The densities of the additionally implanted dopants are determined so as to attain the desired threshold voltages Vth.

Next, after a cleaning of the surface of the silicon substrate 101, the oxidizing annealing at 900° C. for 60 seconds in $O_2$ gas atmosphere is carried out to form the gate insulators 105A, 106A. The gate insulators 105A and 106A have a thickness of 20 Å.

Figure 9B:
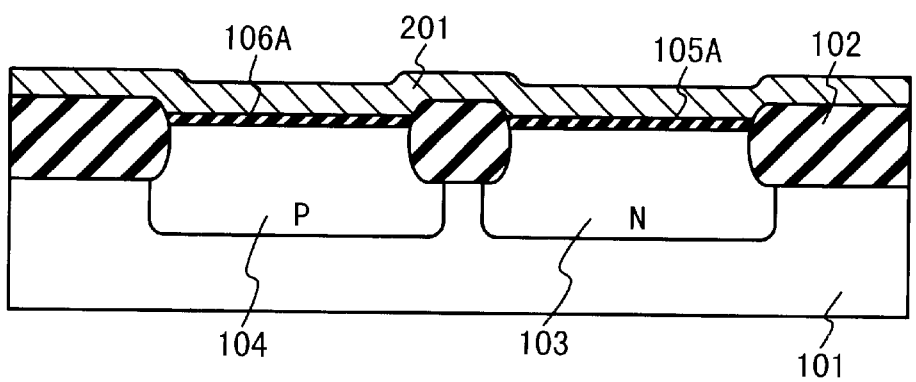
Figure 9C:
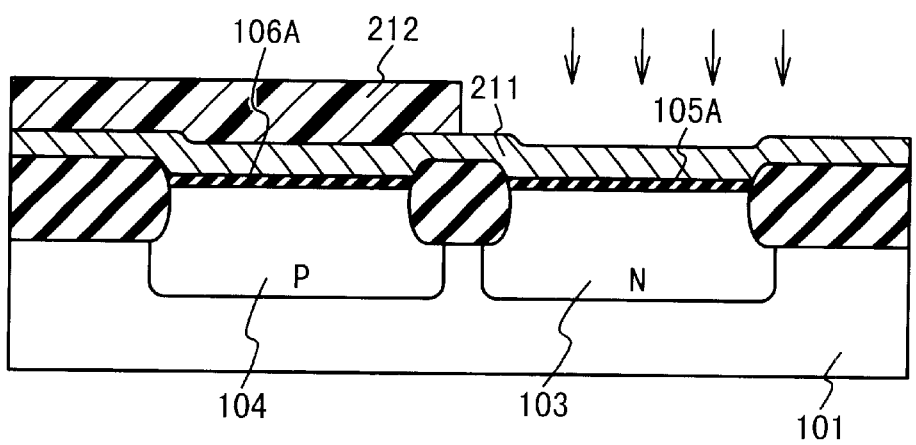

Next, as shown in FIG. 9B, a polycrystalline silicon film 211 having a thickness of about 1500 Å is grown by an LPCVD. Then a photo resist 212 having a necessary thickness is selectively formed in the NMOSFET formation region as shown in FIG. 9C. Nitride ions are implanted into only the polycrystalline silicon film 211 of the PMOSFET formation region while the photo resist 212 is used as a mask. The ion implantation is executed with an acceleration energy of 10 to 30 keV. The density of the implanted ions is 0.5 to $1 \times 10^{15}/cm^2$.

Figure 10A:
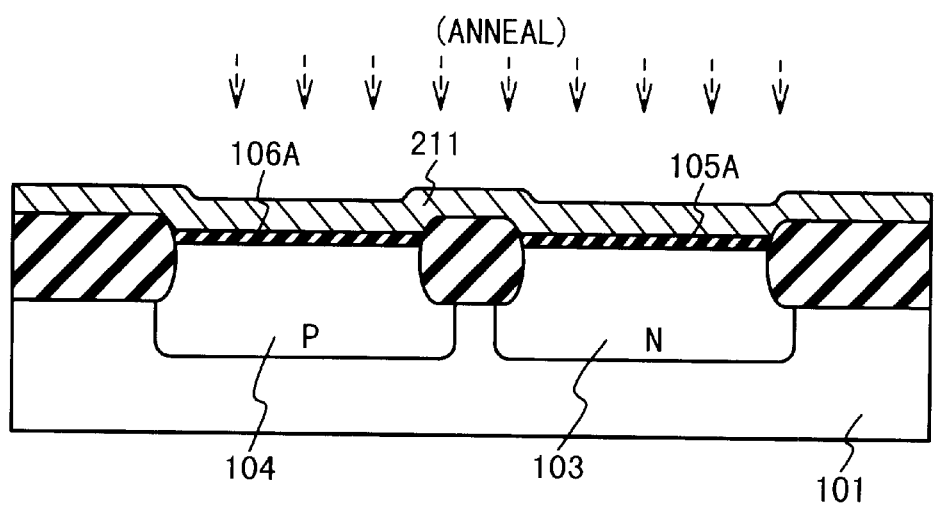
FIGS. 10A and 10B are sectional views showing the manufacturing process in the third embodiment.

After that, as shown in FIG. 10A, the annealing at 900° C. for 10 minutes is done in the $N_2$ gas atmosphere. Many of the implanted nitrogen ions are diffused by the annealing from the polycrystalline silicon film 211 to the gate insulator 105A. The diffused nitrogen ions induce the positive fixed charges in the gate insulator 105A of the PMOSFET. It should be noted that no nitrogen ion is diffused into the gate insulator 106A of the NMOSFET. Fixed charges are excluded in the gate insulator 106A.

Figure 10B:
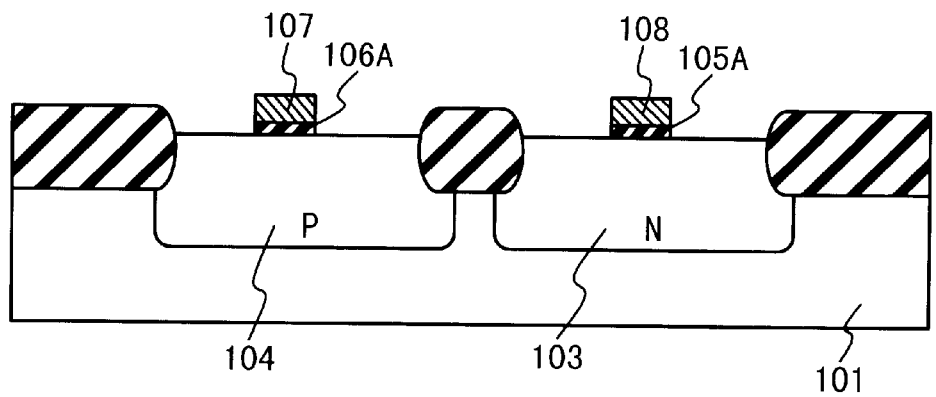

Next, as shown in FIG. 10B, the polycrystalline silicon film 211 is patterned by the photolithography technique. Accordingly, the respective gate electrodes 107, 108 are formed in the respective MOSFET formation regions.

Then, LDD regions, sidewalls, source/drain regions, an interlayer dielectric and interconnections are formed in the same way as the first, which is explained with reference to FIGS. 6A to 7D. As shown in FIG. 6A, after the PMOSFET formation region is covered by the photo resist 202, arsenic ions are implanted into the NMOSFET formation region to form the N-type LDD region 112. Next, as shown in FIG. 6B, after the NMOSFET formation region is covered by the photo resist 203, the boron fluoride ($BF_2$) ions are implanted into the PMOSFET formation region to form the P-type LDD region 111. Next, as shown in FIG. 6C, the silicon oxide film 204 having a thickness of 100 Å is formed by an LPCVD to cover the silicon substrate 101. As shown in FIG. 6D, the silicon oxide film 204 is anisotropically etched to form the sidewalls 109, 110 on the sides of the gate electrodes 107, 108.

As shown in FIG. 7A, after the PMOSFET formation region is covered by the photo resist 205, arsenic ions are implanted into the NMOSFET formation region to form the N+ source/drain regions 114. Next, as shown in FIG. 7B, after the NMOSFET formation region is covered by the photo resist 206, the boron ions are implanted into the PMOSFET formation region to form the P+ source/drain regions 113.

After that, as shown in FIG. 7C, an annealing is executed to activate the implanted dopants. Then, as shown in FIG. 7D, the interlayer dielectric 115 is formed to cover the silicon substrate 101. Then, the contact hole 116 and the aluminum interconnections 117 are formed. Accordingly, the semiconductor apparatus in the third embodiment is manufactured.

Figure 11:
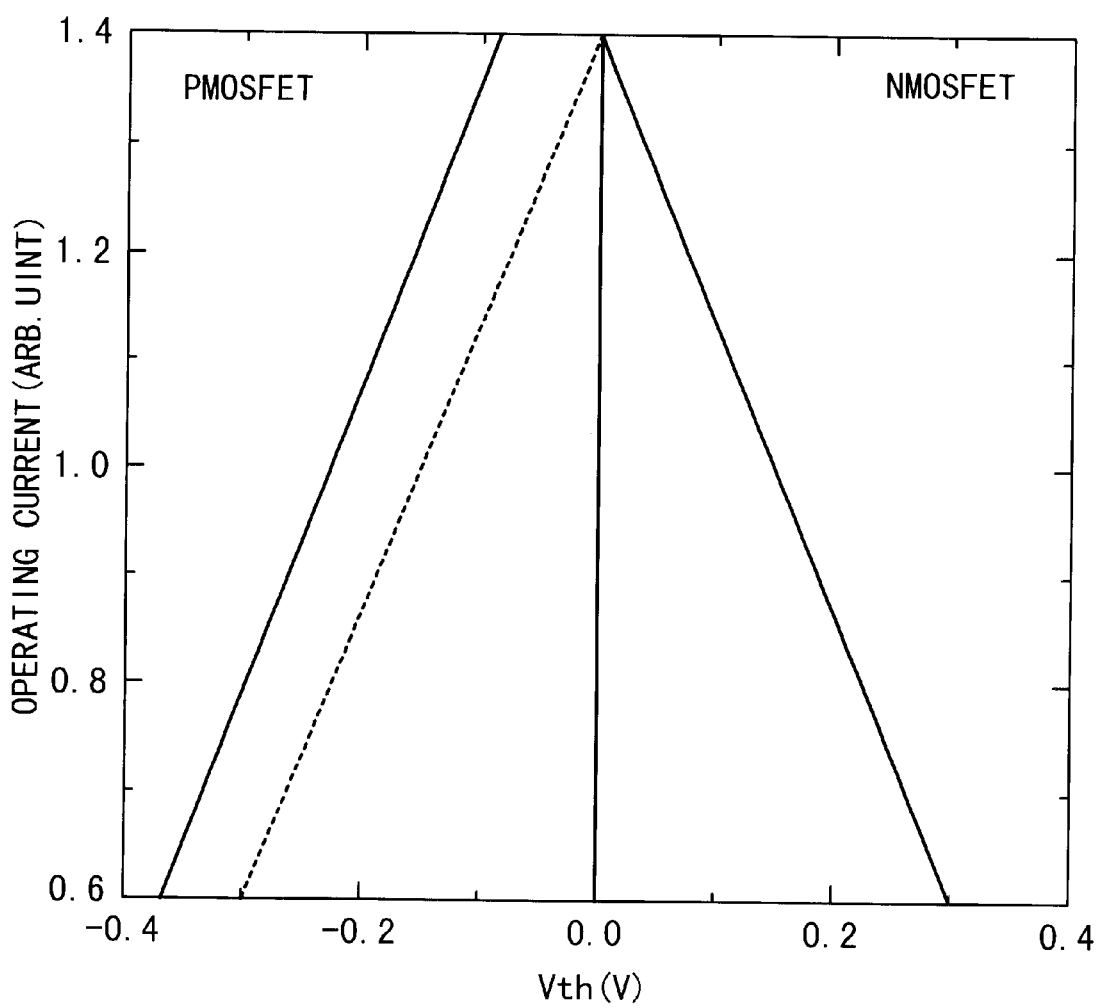
FIG. 11 shows threshold voltages of a PMOSFET and an NMOSFET in the third embodiment.

In the third embodiment, the positive fixed charges existing in the gate insulator 105A of the PMOSFET allows to decrease the impurity concentration in the channel region of the PMOSFET to attain the desired threshold voltage of the PMOSFET. Thus, as shown in FIG. 11, the operating current of the PMOSFET is increased for the predetermined threshold. On the other hand, since no fixed charge exists in the gate insulator 106A of the NMOSFET, there is no change in the impurity concentration in the channel region of the NMOSFET to obtain the desired threshold voltage. Therefore, the operating current of the NMOSFET is maintained. Hence, the total operating current of the CMOS circuit is increased due to the increase in the operating current of the PMOSFET. The increased operating current improves the operation speed of the CMOS circuit.

In addition, the nitrogen ions diffused into the gate insulator 106A of the PMOSFET reduce boron penetration from the gate electrode 107 to the channel region of the PMOSFET. The positive fixed charges induced by the nitrogen ions fix the boron dopants in the gate electrode 107, and thereby reduces the boron penetration.

Fourth Embodiment

Figure 12A:
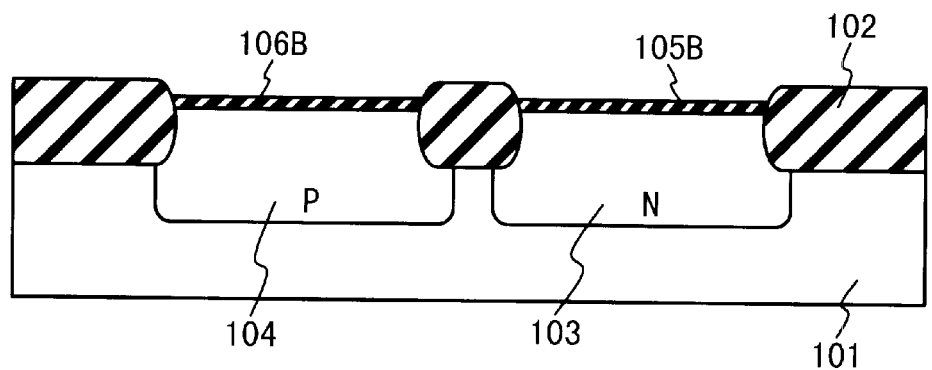
FIGS. 12A to 12C are sectional views showing a manufacturing process in a fourth embodiment.

In a fourth embodiment, the semiconductor apparatus has the same configuration as that in the first embodiment except for the gate insulators. As shown in FIG. 12A, the gate insulator 105 and 106 in the first embodiment are respectively replaced by gate insulators 105B, and 106B which are made of silicon oxide.

The charge densities of the gate insulator 105B, and 106B in the fourth embodiment are different from those of the gate insulators 105, and 106 in the first embodiment. In the fourth embodiment, the gate insulator 105B of the PMOSFET contains substantially no fixed charges whiled negative fixed charges exist in the gate insulator 106B.

The method for manufacturing the semiconductor apparatus in the fourth embodiment is described below. At first, as shown in FIG. 12A, the silicon substrate 101 is selectively oxidized to form the field oxide film 102. The field oxide film 102 separates the PMOSFET formation region and the NMOSFET formation region.

Then, N-type dopants such as phosphorus and arsenic are implanted into the PMOSFET formation region to form the N-well 103. Then P-type dopants such as boron are implanted into the NMOSFET formation region to form the P-well 104.

Next, after a cleaning of the surface of the silicon substrate 101, the oxidizing process at 900° C. for 60 seconds is carried out in the $O_2$ gas atmosphere to form the gate insulators 105B, 106B made of silicon oxide respectively on the N-well 103 and the P-well 104. The gate insulators 105B, 106B have a thickness of 20 Å.

Figure 12B:
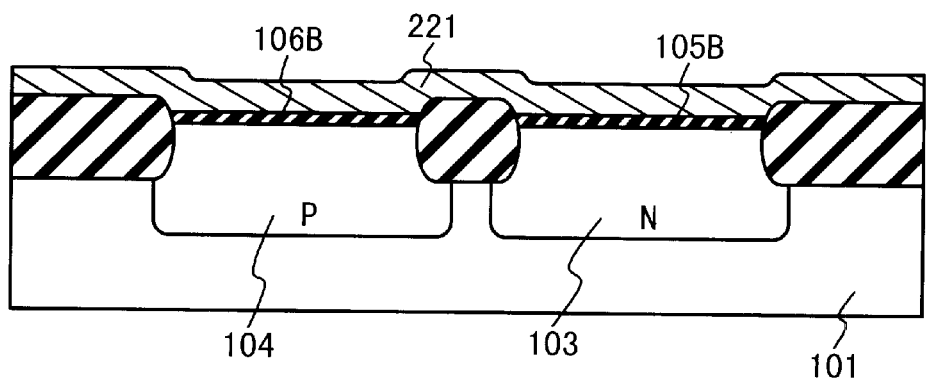
Figure 12C:
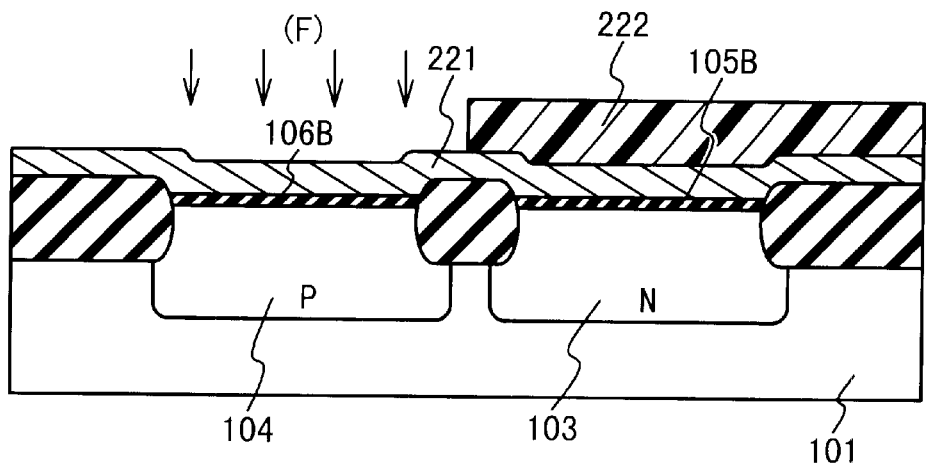

As shown in FIG. 12B, a polycrystalline silicon film 221 having a thickness of about 1500 Å is grown by an LPCVD. Then, as shown in FIG. 12C, a photo resist 222 is selectively formed in the PMOSFET formation region. Fluorine ions are implanted into the polycrystalline silicon film 221 over the NMOSFET formation region while the photo resist 222 is used as the mask. The ion implantation is executed with an acceleration energy of 10 to 30 keV, and the implant dose level of the fluorine ions is 0.5 to $1 \times 10^{14}/cm^2$. After the removal of the photo resist 222, an annealing is executed at 900° C. for 10 minutes in the $N_2$ gas atmosphere. Many of the implanted fluorine ions are diffused from the polycrystalline silicon film 221 into the gate insulator 106B. Hence, the diffused fluorine ions induce the negative fixed charges in the gate insulator 106B of the NMOSFET. Then the polycrystalline silicon film 221 is patterned by the photolithography technique to form gate electrodes of the PMOSFET and the NMOSFET.

Then, LDD regions, sidewalls, source/drain regions, an interlayer dielectric and interconnections are formed in the same way as the first embodiment, which is explained with reference to FIGS. 6A to 7D.

Figure 13:
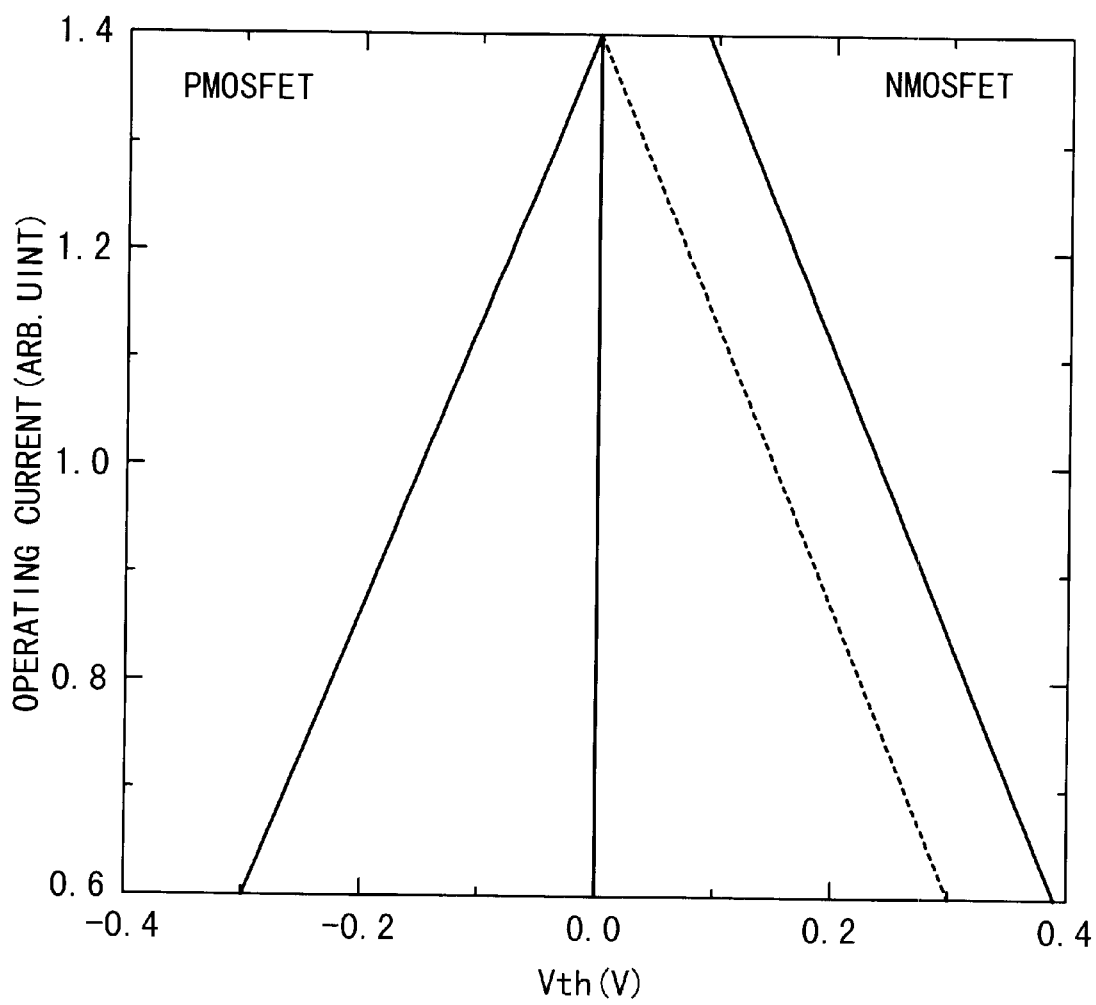
FIG. 13 shows threshold voltages of a PMOSFET and an NMOSFET in the fourth embodiment.

In the fourth embodiment, the negative fixed charges existing in the gate insulator 106B of the NMOSFET allows to decrease the impurity concentration of the channel region in NMOSFET to attain the desired threshold voltage. Thus, as shown in FIG. 13, the operating current of the NMOSFET is increased for the same threshold voltage of the NMOSFET. On the other hand, since no fixed charge exists in the gate insulator 105B of the PMOSFET, there is no change in the channel impurity concentration of the PMOSFET. This results in that the operating current in the PMOSFET is maintained. Hence, the total operating current of the CMOS circuit is increased due to the increase in the operating current of the NMOSFET. The increase of the total operating current improves the operation speed of the CMOS circuit.

Fifth Embodiment

Figure 14A:
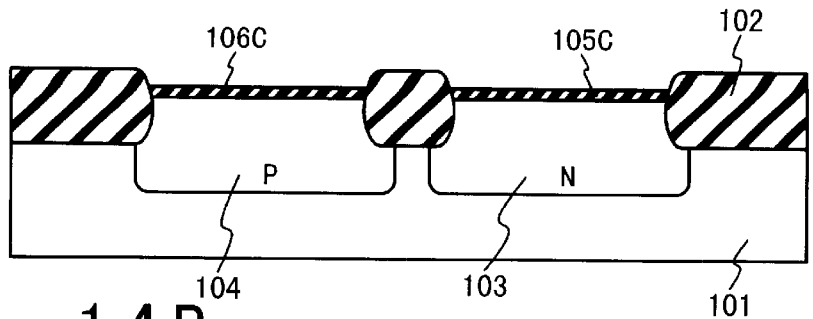
FIGS. 14A to 14C are sectional views showing a manufacturing process in a fifth embodiment.

In a fifth embodiment, the semiconductor apparatus has the same configuration as the first embodiment except for gate insulators. As shown in FIG. 14A, the gate insulator 105 and 106 in the first embodiment are respectively replaced by gate insulators 105A, and 106A which are made of silicon oxide.

The charge densities of the gate insulators 105C, 106C in the fifth embodiment are different form those of the gate insulators 105, 106 in the first embodiment. The gate insulator 105C of the PMOSFET contains positive fixed charges while the gate insulator 106C of the NMOSFET contains negative fixed charges.

The method for manufacturing the semiconductor apparatus in the fifth embodiment is described below. At first, as shown in FIG. 14A, the surface of the silicon substrate 101 is selectively oxidized to form the field oxide film 102 made of silicon oxide. The field oxide film 102 separates the PMOSFET formation region and the NMOSFET formation region. Then, the N-type dopants such as phosphorus and arsenic are implanted into the PMOSFET formation region to form the N-well 103, and the P-type dopants such as boron are implanted into the NMOSFET formation region to form the P-well 104. Next, after cleaning the surface of the silicon substrate 101, an oxidation at 900° C. for 60 seconds is carried out in the $O_2$ gas atmosphere to form the gate insulators 105C, 106C respectively on the surfaces of the N-well 103 and the P-well 104. The gate insulators 105C, and 106C have a thickness of 20 Å.

Figure 14B:
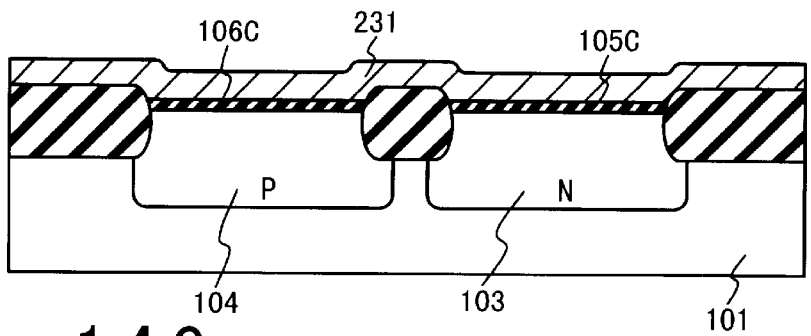
Figure 14C:
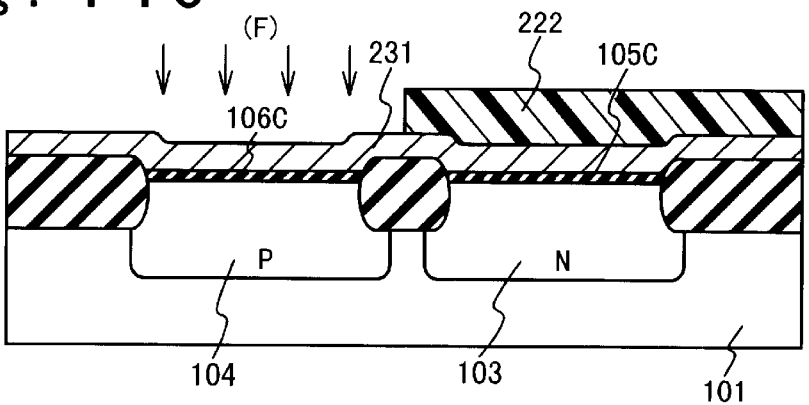
Figure 14D:
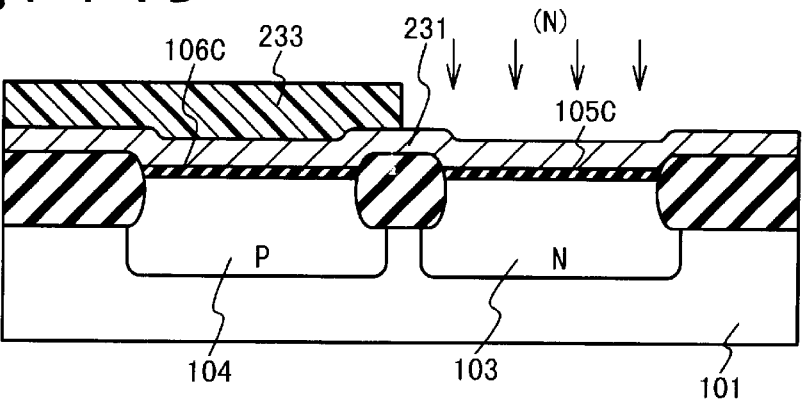

Next, as shown in FIG. 14B, a polycrystalline silicon film 231 having a thickness of about 1500 Å is grown by an LPCVD. Then, a photo resist 232 is selectively formed in the PMOSFET formation region as shown in FIG. 14C. Then, fluorine ions are implanted into the polycrystalline silicon film 231 of the NMOSFET formation region while the photo resist 232 is used as the mask. The ion implantation is executed with an acceleration energy of 10 to 30 keV at an implant dose level of 0.5 to $1 \times 10^{14}/cm^2$. After the removal of the photo resist 222, a photo resist 233 is selectively formed in the NMOSFET formation region as shown in FIG. 14D. Nitrogen ions are implanted into the polycrystalline silicon film 231 of the PMOSFET formation region while the photo resist 233 is used as the mask. The ion implantation is executed with an acceleration energy of 10 to 30 keV at an implant dose level of 0.5 to $1 \times 10^{15}/cm^2$.

After removing the photo resist 233, an annealing is executed at 900° C. for 10 minutes in the $N_2$ gas atmosphere. In the NMOSFET formation region, many of the implanted fluorine ions are diffused from the polycrystalline silicon film 231 to the gate insulator 106C. In the PMOSFET formation region, on the other hand, many of the implanted nitrogen ions are diffused from the polycrystalline silicon film 231 into the gate insulator 105C. The diffused fluorine ions induces negative fixed charges in the gate insulator 106C of the NMOSFET, the diffused nitrogen ions induces the positive fixed charges in the gate insulator 105C of the PMOSFET.

Then polycrystalline silicon film 231 is patterned by the photolithography technique to form the gate electrodes of the PMOSFET and the NMOSFET.

Then, LDD regions, sidewalls, source/drain regions, an interlayer dielectric and interconnections are formed in the same way as the first embodiment, which is explained with reference to FIGS. 6A to 7D.

Figure 15:
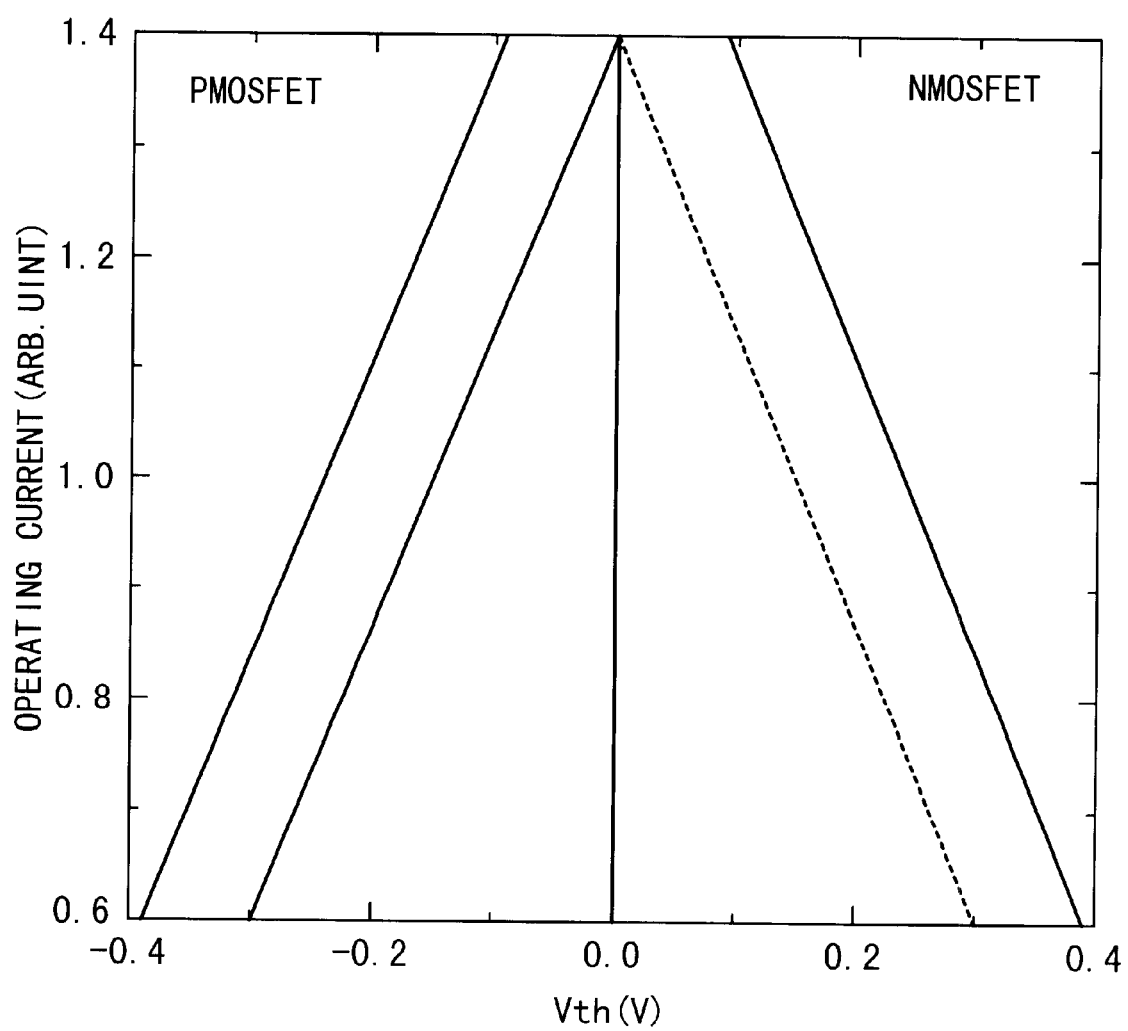
FIG. 15 shows threshold voltages of a PMOSFET and an NMOSFET in a fifth embodiment.

In the fifth embodiment, the positive fixed charges existing in the gate insulator 105C of the PMOSFET allows to decrease the impurity concentration of the channel region of the PMOSFET to attain the desired threshold voltage. Thus, as shown in FIG. 15, the operating current of the PMOSFET is increased for the predetermined threshold voltage of the PMOSFET.

On the other hand, the negative fixed charges existing in the gate insulator 106C of the NMOSFET allows to decrease the impurity concentration of the channel region to attain the desired threshold voltage. The operating current of the NMOSFET is increased for the predetermined threshold voltage. Thus, the operating current of the PMOSFET and the operating current of the NMOSFET are both increased. The increased operating currents improve the operation speed of the CMOS circuit.

In addition, the nitrogen ions diffused into the gate insulator 106A of the PMOSFET reduce boron penetration from the gate electrode 107 to the channel region of the PMOSFET. The positive fixed charges induced by the nitrogen ions fix the boron dopants in the gate electrode 107, and thereby reduces the boron penetration.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A semiconductor apparatus comprising:

a P-channel MISFET (Metal Insulator Semiconductor Field Effect Transistor) including a first gate insulator which contains first positive charges therein; and an N-channel MISFET including a second gate insulator which contains second positive charges therein, wherein a first charge density of said first positive charge is larger than a second charge density of said second positive charge, a circuit includes said P-channel MISFET and said N-channel MISFET, an increase in an operating current of said P-channel MISFET is greater than a decrease in another operating current of said N-channel MISFET, threshold voltages of said N-channel MISFET and said P-channel MISFET being determined by varying impurity concentrations therein, said first positive charge and said second positive charge being fixed charges.

2. The semiconductor apparatus according to claim 1, wherein said first charge density is three to four times as large as said second charge density.

3. The semiconductor apparatus according to claim 1, wherein said first and second gate insulators are formed of silicon oxinitride.

4. The semiconductor apparatus according to claim 1, wherein said first positive charges are induced by nitrogen ions.

5. The semiconductor apparatus according to claim 1, wherein said second positive charges are induced by nitrogen ions.

6. The semiconductor apparatus of claim 1, wherein said impurity concentration in said P-channel MISFET is decreased to obtain a threshold voltage thereof while said impurity concentration in said N-channel MISFET is increased to obtain another threshold voltage thereof.

7. The semiconductor apparatus of claim 1, wherein said N-channel MISFET and said P-channel MISFET are separated by a filed oxide film formed on a surface of a substrate.

8. The semiconductor apparatus of claim 1, wherein said P-channel MISFET comprises:

an N-well formed on a surface portion of a silicon substrate in a P-channel MISFET formation region;

said first gate insulator formed on said N-well; and a gate electrode formed on said first gate insulator.

9. The semiconductor apparatus of claim 8, further comprising:

sidewalls formed on both sides of said gate electrode.

10. The semiconductor apparatus of claim 8, further comprising:

lightly doped drain regions and P+ source/drain regions formed in surface portions of said N-well, said lightly doped drain regions being lightly doped with P-type dopants and said P+ source/drain regions being heavily doped with P-type dopants.

11. The semiconductor apparatus of claim 10, wherein said N-channel MISFET comprises:

an P-well formed on a surface portion of a silicon substrate in a N-channel MISFET formation region;

said second gate insulator formed on said P-well; and a second gate electrode formed on said second gate insulator.

12. The semiconductor apparatus of claim 11, further comprising:

sidewalls formed on both sides of said second gate electrode.

13. The semiconductor apparatus of claim 11, further comprising:

lightly doped drain regions and N+ source/drain regions formed in surface portions of said P-well, said lightly doped drain regions being lightly doped with N-type dopants and said N+ source/drain regions being heavily doped with N-type dopants.

14. The semiconductor apparatus of claim 13, wherein said N-channel MISFET and said P-channel MISFET are connected by interconnections to form a CMOS circuit.

15. The semiconductor apparatus of claim 14, wherein a CMOS circuit is a CMOS inverter, one of said P+ source/drain regions is connected to a power supply terminal by a portion of said interconnections, and another of said P+ source/drain regions is connected to one of said N+ source/drain regions by another portion of said interconnections, another of said N+ source/drain regions being connected to a grounded terminal.

16. The semiconductor apparatus of claim 15, wherein said first and second gate electrodes are connected to each other.

17. A semiconductor apparatus comprising:

a P-channel MISFET (Metal Insulator Semiconductor Field Effect Transistor) including a first gate insulator containing charges selected from the group consisting of:

substantially no charges therein, and positive charges therein; and an N-channel MISFET including a second gate insulator, wherein threshold voltages of said P-channel MISFET and said N-channel MISFET are determined by changing the concentration of impurities therein in accordance with the charges of each of said P-channel MISFET and said N-channel MISFET.

* * * * *